US009098665B2

(12) United States Patent
Parthasarathy et al.

(10) Patent No.: US 9,098,665 B2
(45) Date of Patent: Aug. 4, 2015

(54) PRIORITIZED SOFT CONSTRAINT SOLVING

(71) Applicant: Synopsys, Inc., Mountain View, CA (US)

(72) Inventors: Ganapathy Parthasarathy, Sunnyvale, CA (US); Dhiraj Goswami, Wilsonville, OR (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 14/209,579

(22) Filed: Mar. 13, 2014

(65) Prior Publication Data

US 2014/0282343 A1  Sep. 18, 2014

Related U.S. Application Data

(60) Provisional application No. 61/780,098, filed on Mar. 13, 2013.

(51) Int. Cl.
*G06F 17/50*  (2006.01)

(52) U.S. Cl.
CPC ........ *G06F 17/5068* (2013.01); *G06F 17/5045* (2013.01)

(58) Field of Classification Search
USPC .................................. 716/106, 111, 122, 136
See application file for complete search history.

(56) References Cited

U.S. PATENT DOCUMENTS

| 5,842,192 | A   | * | 11/1998 | Garcia et al. ................. 706/45 |
| 5,855,009 | A   | * | 12/1998 | Garcia et al. ................. 706/45 |
| 7,627,461 | B2  | * | 12/2009 | Guyaguler et al. ............ 703/10 |
| 8,296,710 | B2  |   | 10/2012 | Liu et al. |
| 8,307,372 | B2  |   | 11/2012 | Feblowitz et al. |
| 8,311,878 | B2  | * | 11/2012 | Subramanian et al. ....... 705/7.35 |
| 8,315,894 | B2  | * | 11/2012 | Naveh et al. ................. 705/7.11 |
| 2012/0102199 | A1 |  | 4/2012 | Hopmann et al. |

OTHER PUBLICATIONS

Walsh, Toby. "Stochastic constraint programming." ECAI. vol. 2. 2002.
Iyer, Mahesh A. "Race: A word-level ATPG-based constraints solver system for smart random simulation." 2013 IEEE International Test Conference (ITC). IEEE Computer Society, 2003.

\* cited by examiner

*Primary Examiner* — Sun Lin
(74) *Attorney, Agent, or Firm* — Adams Intellex, PLC

(57) ABSTRACT

A design problem can include a mixture of hard constraints and soft constraints. The soft constraints can be prioritized and the design problem solved. One or more soft constraints may not be honored in the midst of the solving of the design problem. Debugging can be performed and the unsatisfied soft constraints identified. Root-cause analysis can evaluate the challenges within the design problem which caused soft constraints not to be honored.

29 Claims, 7 Drawing Sheets

PRIORITIZED SOFT CONSTRAINT SOLVING

RELATED APPLICATIONS

This application claims the benefit of U.S. provisional patent application "Prioritized Soft Constraint Solving" Ser. No. 61/780,098, filed Mar. 13, 2013. The foregoing application is hereby incorporated by reference in its entirety.

FIELD OF ART

This application relates generally to semiconductor circuit design and more particularly to prioritized soft constraint solving in a design tool.

BACKGROUND

The cost of correcting a design error within an electronic system increases radically as each step in a design process passes and the likelihood of an error going without being discovered grows. Thus, if a designer finds an error during the design phase of a logical block, the error costs much less to correct than if the designer finds the same error during final verification before tape-out. But correcting an error found at final verification before tape-out costs less than correcting an error found in physical validation, which in turn costs less than correcting an error discovered in a customer-ready application.

A technology business' success depends on the design process yielding functionally correct hardware efficiently and at the lowest possible cost. Since design verification must determine whether a proposed circuit design functions according to a specification, extensive analysis and verification are required to ensure compliance. To ensure the proper operation of both the particular circuit and the system as a whole, the circuit must be verified using various simulation tools to ensure that it successfully meets a specification. Since current design-verification tools cannot perform detailed evaluation of entire circuits—especially large circuits—quickly or efficiently enough to be viable, circuit designers have employed an approach to verification that maximizes coverage. For example, traditional verification methods are based on test benches. Test benches function as a verification technique by applying sequences of test vectors to circuit inputs and monitoring the results at the same circuit's outputs. If the outputs produce expected values, the circuit is thought to function properly. However, the increased test duration and difficulty inherent in verifying complex modern circuit designs renders the test-bench approach less efficient at finding design errors. Further, current methods do not scale to large electronic systems comprising perhaps hundreds of millions of devices.

Modern circuit designers have turned to the technique of constrained random verification to gauge the functionality of complex modern circuit arrangements. The test bench generates a random (or pseudo-random) set of test vectors, which may represent a much wider range of values than possible using the fixed sequences previously employed. However, such arbitrary, random values may not properly stimulate a design in situ. Thus, the random values must be constrained to encapsulate the context of the system or subsystem being tested. The constraints may be hard constraints or soft constraints. A hard constraint is a constraint that must always be met, while a soft constraint should be met if possible. Due to the complexity of modern electronic systems, there is a possibility that constraints may be contradictory or otherwise incompatible, either due to mistakes by the individual or individuals defining the constraints, or through difficult-to-understand interactions between the constraints.

SUMMARY

A design problem includes soft constraints. The soft constraints are prioritized and the design problem is solved. If a solution to the design problem does not satisfy all of the soft constraints, an unsatisfied soft constraint is identified. In some embodiments, a root cause of the unsatisfied constraint is also identified. A computer-implemented method for design implementation is disclosed comprising: obtaining a set of constraints for a design problem; recognizing a plurality of soft constraints within the set of constraints; prioritizing one or more of the plurality of soft constraints; solving the design problem; and determining at least one soft constraint which is not honored by the solving.

The method can further comprise identifying a root cause for not honoring the at least one soft constraint which is not honored. The method may also further comprise performing resource allocation so that the design problem is solved within global resource limits identified by the resource allocation. The method may include caching a solution for the design problem, based on the solving, into problem storage. The method may further comprise partitioning the design problem into sub-problems based on the resources. The method may also include identifying a root cause for not honoring the at least one soft constraint which was not met, and reporting the root cause.

In embodiments, a computer-implemented method for semiconductor design implementation may comprise: obtaining a set of constraints that define a semiconductor design problem wherein solving the design problem provides a specific chip operation; recognizing a plurality of soft constraints within the set of constraints wherein the plurality of soft constraints provide preferred but not absolute needs for a semiconductor chip; prioritizing one or more of the plurality of soft constraints; solving the design problem; determining a soft constraint which is not honored by the solving; and debugging the soft constraint which is not honored. In some embodiments, a computer system for design implementation may comprise: a memory which stores instructions; one or more processors coupled to the memory wherein the one or more processors are configured to: obtain a set of constraints for a design problem; identify a plurality of soft constraints within the set of constraints; prioritize one or more of the plurality of soft constraints; solve the design problem; and identify at least one soft constraint which is not honored by the solving. In embodiments, a computer program product embodied in a non-transitory computer readable medium for design implementation may comprise: code for obtaining a set of constraints for a design problem; code for recognizing a plurality of soft constraints within the set of constraints; code for prioritizing one or more of the plurality of soft constraints; code for solving the design problem; and code for determining at least one soft constraint which is not honored by the solving.

Various features, aspects, and advantages of various embodiments will become more apparent from the following further description.

BRIEF DESCRIPTION OF THE DRAWINGS

The following detailed description of certain embodiments may be understood by reference to the following figures wherein.

DETAILED DESCRIPTION

Figure 1:
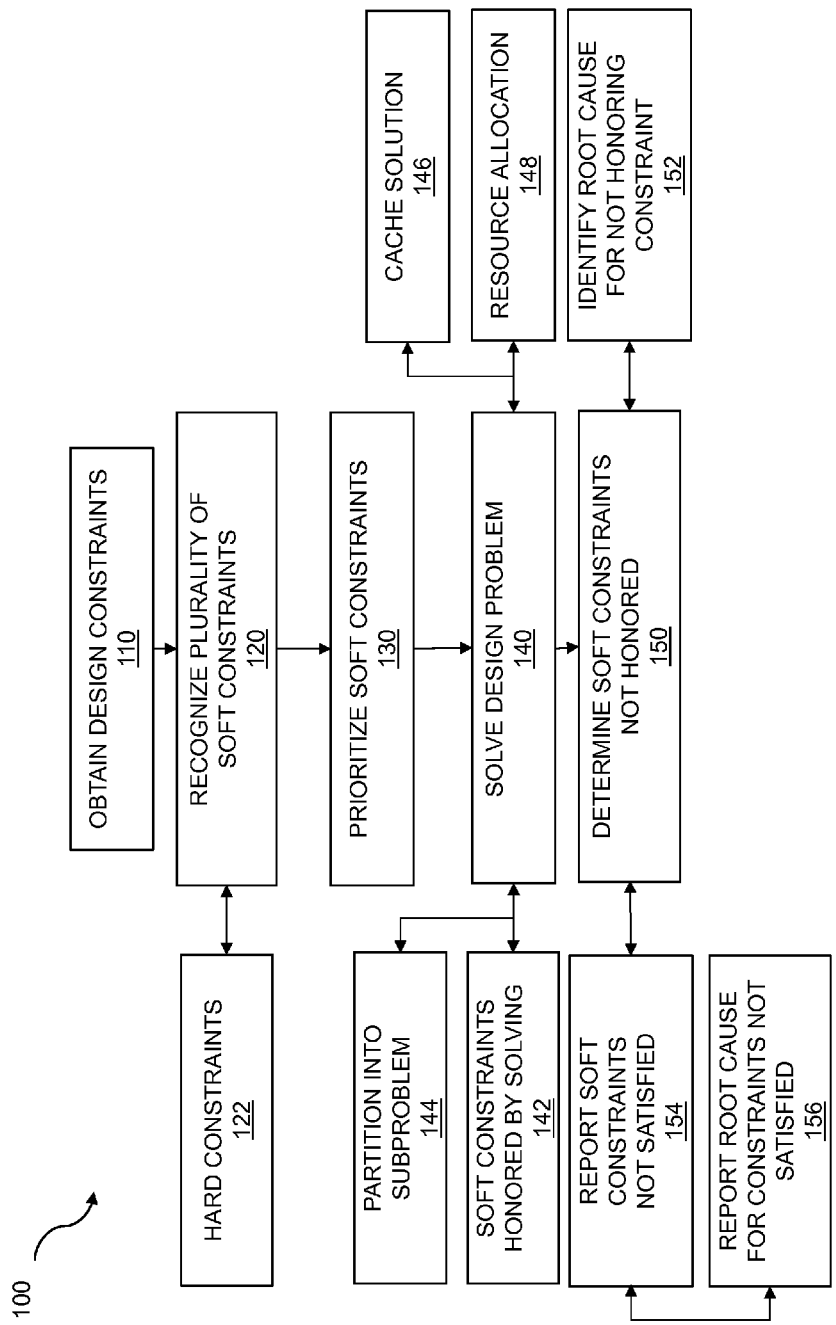
FIG. 1 is a flow diagram for prioritized soft constraint solving.

Modern electronic system design often utilizes high-level design information to describe the design. Various aspects of the design can be referred to as a design problem, such as the functional behavior of a circuit, the timing of a circuit, the verification vectors for a circuit, or any other aspect of the design. In embodiments, the high-level design information for a design problem is expressed in a design language such as Verilog™, VHDL™, SystemVerilog™, SystemC™, Vera™, e™, or another design language. A constraint represents one construct supported in some design languages that is useful for describing many design problems. Constraints are either hard—any valid solution to a design problem must satisfy a hard constraint—or soft—a valid design-problem solution may or may not satisfy a soft constraint. Even so, a solution to a design problem will try to meet as many soft constraints as possible.

One powerful technique for verification is known as constrained random verification. In constrained random verification, a test bench uses constraints to restrict random stimuli generated by a pseudo-random number generator or process, with, in embodiments, the restricted stimuli used to verify a design. In some embodiments, a constraint solver is used to generate a random solution which satisfies the user-specified (programmed) constraints. In embodiments, solving the design problem includes repeated calls to the constraint solver in order to generate the random stimuli required for successful verification of the electronic system.

In embodiments, solving a constrained random design problem, such as is often performed in semiconductor verification, involves mapping defined constraints to a final constraint problem. Because, in some embodiments, the definition of the constraints is very complicated and involves direct dependencies between constraints, indirect dependencies between constraints, and implied dependencies between constraints, inconsistencies in the constraints at times exist. While all hard constraints must be met by valid solutions, valid solutions include one or more unmet soft constraints. While a solution that does not meet all of the soft constraints can be valid, at times it is helpful for the designer to understand which soft constraints are not met by a solution and the root cause behind the unmet constraints. In embodiments, such information is valuable in determining whether a solution is truly consistent with the desired behavior of the circuit, and in helping the designer determine how to modify the constraints to more accurately describe the desired behavior.

In embodiments, to determine which soft constraints can be honored and which soft constraints cannot be honored, the soft constraints are prioritized. In some embodiments the priority order is determined by the order in which the soft constraints are declared in the design information. In other embodiments, soft constraints declared earlier in the design information have a lower priority than soft constraints declared later; that is, the soft constraints are declared in a reverse-priority order. It should be noted that, in certain embodiments, all hard constraints contained in design information are considered higher-priority constraints than all soft constraints.

A solution, which, in embodiments, does not meet all soft constraints, is be found by repeated calls to the solver with different sets of the soft constraints enabled, or turned on. In embodiments, the design problem is first solved using only the hard constraints, i.e. with all the soft constraints disabled, to ensure that the design problem can be solved in a way that meets all the hard constraints. In other embodiments, the solver is then called with the hard constraints and the highest priority soft constraint. In alternative embodiments additional calls to the solver are made, each time adding the next-highest priority soft constraint, until the solver is unable to solve the design problem. This allows the designer to identify the soft constraint that renders the problem unsolvable, as the most recently added soft constraint is not always satisfied in a design solution.

To determine the root cause of the inability to honor the soft constraint, in embodiments, multiple calls to the solver are made, with the hard constraints and the unsatisfied soft constraint enabled, but with differing sets of the higher priority soft constraints enabled each call. In some embodiments, the set of soft constraints with higher priority than the unsatisfied soft constraint are searched for sets of soft constraints that, if disabled, would allow the unsatisfied soft constraint to be satisfied. In at least one embodiment, a binary-tree search algorithm is used to determine the root cause.

In some embodiments, the unsatisfied, unmet soft constraint is reported to the user. The root cause, which, in certain embodiments, includes one or more hard constraints and/or one or more soft constraints having a higher priority than the unsatisfied soft constraint, is in some embodiments, reported to the user. In other embodiments, additional calls to the solver, with the unsatisfied soft constraint disabled, are made with another lower-priority soft constraint added in each successive call. It should be understood that the disclosed concepts apply to other types of problem generation beyond semiconductor verification. In embodiments, semiconductor timing, other design problems, and numerous other computational problems are evaluated using these techniques.

FIG. 1 is a flow diagram for prioritized soft constraint solving. The flow 100 shows a computer-implemented method for design implementation. In embodiments, the design problem relates to a semiconductor chip. In other embodiments, the design problem is described using a design language including, but not limited to, Verilog™, VHDL™, SystemVerilog™, SystemC™, Vera™, e™, or some other language. In some embodiments, the design problem includes one or more of verification, timing, power, or area. In certain embodiments, the design problem is represented as a random process, such that the design problem, in embodiments, describes a set of random verification vectors. In some embodiments, information on timing includes one or more of setup time, hold time, access time, or cycle time, depending on the embodiment. The design problem includes analysis of arrival time or slack time in some embodiments. In embodiments, information on power includes one or more of standby power, leakage power, dynamic power, power-down power, or static power. In other embodiments information on area includes one or more of metallization area, diffusion area, or polysilicon area.

In embodiments, the design problem includes a set of constraints. The flow 100 includes obtaining a set of constraints for a design problem 110. In other embodiments, the constraints include hard constraints, constraints which must be met by any valid solution, and soft constraints, constraints which may or may not be met by a valid solution to the design problem. In some embodiments, the constraints are explicitly defined, in other embodiments; constraints are implicit in other constructs within the description. The flow 100 includes recognizing a plurality of soft constraints 120 within the set of constraints, and in some embodiments, will further include identifying hard constraints 122 within the set of constraints.

The flow 100 includes prioritizing one or more of the plurality of soft constraints 130. In embodiments, hard constraints are given equal priority to other hard constrains, but higher priority than any soft constraint. In some embodiments, soft constraints are prioritized by any method, but, in other embodiments, the prioritization is performed using a repeatable method to provide deterministic results to changes in constraints. In some embodiments, the priority is determined based on an order of declaration of the soft constraints in the design problem description. In at least one embodiment, the priority is determined based on increasing priority for a later declaration; the first soft constraint declared holds the lowest priority, the next soft constraint declared holds the next-higher priority, the third soft constraint declared holds the next-higher priority still, and so on, with increasing priority for each additional soft constraint declared. In some embodiments, priorities are assigned using an ordered walk on an object graph that includes the soft constraints. In some embodiments, the semantics of the particular design language used determine the priority of the soft constraints. In other embodiments, the syntax of the design language allows the designer to explicitly classify the priority of one or more soft constraints with respect to each other or to other soft constraints. In some embodiments, the priority order of the soft constraints within a file can be determined by declaration order within the file, but in other embodiments, the priority order of the soft constraints between files is determined using compilation order, linking order, or explicit declarations of relative priority order between files.

The flow 100 includes solving the design problem 140. In embodiments, the solving of the design problem involves meeting requirements for all of the hard constraints and in certain embodiments involves meeting requirements for one or more soft constraints 142. However, in at least some embodiments, the solving of the design problem will not satisfy all of the plurality of soft constraints. It should be noted that in this specification, meeting a constraint requirement is analogously referred to as "satisfying" a constraint, "honoring" a constraint, or "solving" for a constraint. Conversely, if a constraint requirement is not met, then the constraint will not be deemed "satisfied," "honored," or "solved." In embodiments, the solving of the design problem is based on the prioritizing of the one or more of the plurality of soft constraints so that the prioritizing selects higher-priority soft constraints for solving before lower-priority soft constraints. By solving for higher-priority soft constraints before solving for lower-priority soft constraints, lower-priority soft constraints do not impede the honoring of higher-priority soft constraints.

In embodiments, the flow 100 includes partitioning the design problem into sub-problems 144 based on available resources. In some embodiments, resources include computation resources such as processors and/or processing power, memory, disk space, and/or other resources, depending on the embodiment. In embodiments, the flow 100 further comprises performing resource allocation 148 so that the design problem is solved within global resource limits identified by the resource allocation. In embodiments, the resource allocation includes statically partitioning the resources based on the number and complexity of available solver phases. In some embodiments, more complex solver phases are allocated more resources. In other embodiments, actual allocation is based on an empirical analysis of solver phase performance and resource requirements over a representative set of problem instances. In embodiments, the resource partitioning for each phase is further subdivided over the number of soft constraints in the problem, with some resources allocated for checking the final solution. As each soft constraint is solved, or determined to be unsolvable, in embodiments, the remaining resources in the current resource partition are distributed over the remaining unsolved soft constraints. In other embodiments, if there are insufficient resources at any point of the solving in a phase, that phase is aborted and the next phase is pursued. In some embodiments, the flow 100 further comprises caching a solution 146 for the design problem, based on the solving, into problem storage. In embodiments, the caching is based on prioritized constraints, where the prioritized constraints are soft constraints that are part of an object graph and where priorities are assigned using an ordered walk on the object graph. Other embodiments prioritize the soft constraints using a different method for the caching.

The flow 100 includes determining at least one soft constraint which is not honored by the solving 150. In embodiments, the determining includes a call to a solver with a soft constraint being tested along with a prior tested subset of constraints that, in some embodiments, includes the hard constraints and one or more soft constraints with a priority higher than the soft constraint being tested. In embodiments, if the solver is unable to determine a solution with those constraints in place, the soft constraint being tested is not honored. In certain embodiments, depending on the soft constraints defined, some soft constraints will not be honored by the solving.

In embodiments, the flow 100 includes identifying a root cause for not honoring the at least one soft constraint which is not honored 152. To identify the root cause, in embodiments, the solver is called using both the soft constraint which is not honored and the previously tested subset of constraints where at least one of prior tested constraints is disabled. In some embodiments, a binary search of the previously tested subset is performed to find the root cause. In some embodiments, the root cause includes one or more constraints and, in other embodiments includes a hard constraint and/or a soft constraint with a higher priority than the at least one soft constraint which is not honored.

In embodiments, the flow 100 includes reporting the at least one soft constraint which is not honored 154 by the solving. Some embodiments also include a report of the root cause 156 for not honoring the one or more unmet soft constraints. In embodiments, the reporting is accomplished using any method, including generating a report that, in certain embodiments, is displayed or printed, generating an interactive debugging screen to aid the user in determining whether or not constraints should be changed or whether a solution conforms to desired behavior, or any other means of reporting information to one or more users or other computer programs.

Figure 2:
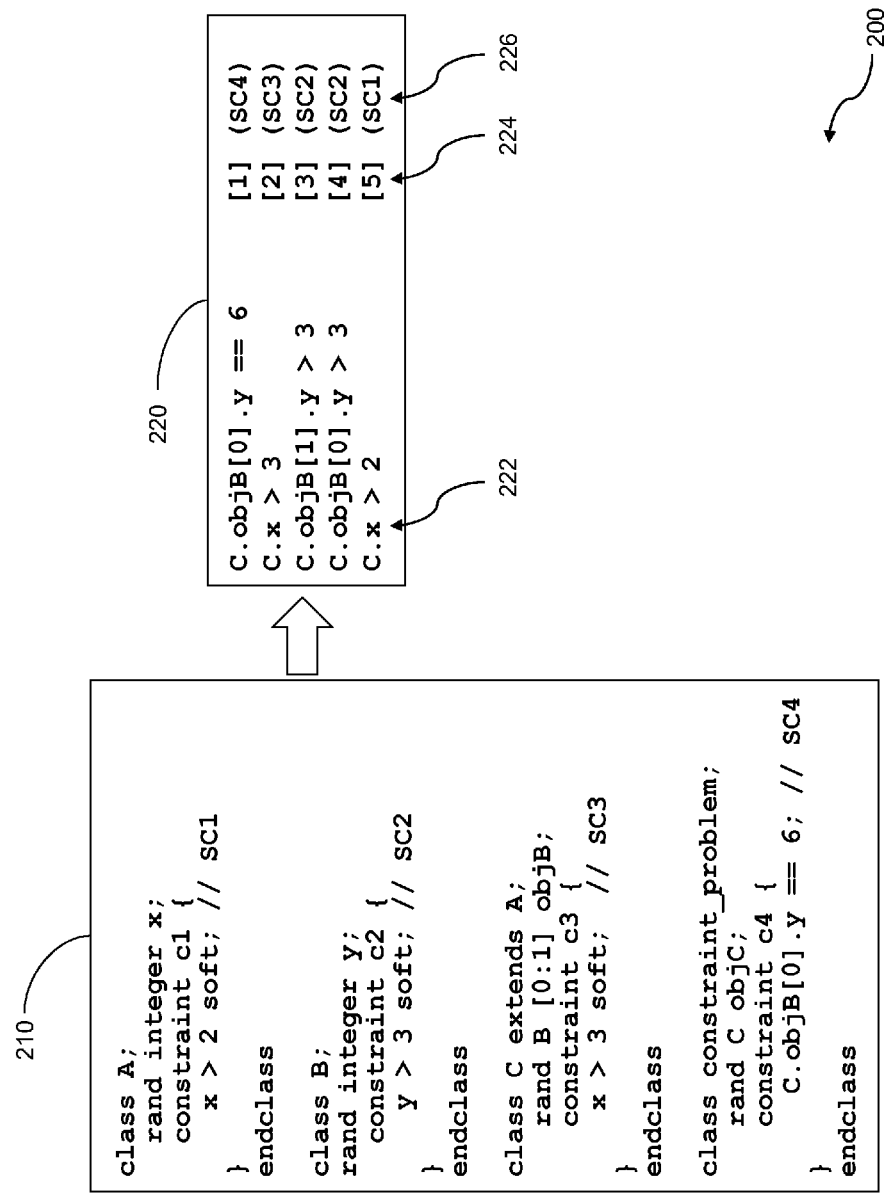
FIG. 2 shows example prioritized soft constraints within a design problem.

FIG. 2 shows example prioritized soft constraints 200 within a design problem. The example pseudo code 210 shows several class declarations including soft constraints. In embodiments, the pseudo code shown is part of a larger design problem. The code shown under the header "class A" defines a random integer 'x' using a soft constraint—SC1 of "x>2." The code under the header "class B" defines a random integer 'y' using a soft constraint—SC2 of "y>3." The code under the header "class C extends A" indicates that any object of class C has all the characteristics of class A. So 'C' objects have an 'x' variable and define an array of two 'B' objects that are of class B along with another soft constraint of "x>3" where 'x' is defined in the class A definition. The code under the header "class constraint_problem" then defines an object 'C' of class C and adds another soft constraint SC4 stating that the $0^{th}$ 'B' object's 'y' variable should equal 6.

The prioritized soft-constraints report 220 includes the soft constraints 222 from the class constraint problem, a predetermined measure of the priority of these soft constraints 224, and an identifier showing the soft constraint declaration 226 from the pseudo code 210. In this manner, some embodiments include identifying a plurality of soft constraints within the set of constraints. In the embodiment shown, the soft constraints are prioritized in reverse order of their declaration so the highest priority soft constraint is "C.objB[0].y=6," which was defined in the class definition of class "constraint_problem" as soft constraint SC4. The second-to-last soft constraint declaration is shown in the definition of class C where the 'x'variable in the 'C' object possesses a soft constraint, "C.x>3," rendering the constraint the second-highest priority. The next-previous soft-constraint declaration is found in the definition of class B. However, an array of 'B' objects is defined under the "class constraint_problem" header. So, to ensure that no two soft constraints have the same priority, a constraint on the last object in the array, "B[1]," is given the next highest priority, and "C.objB[1].y>3" is assigned the third priority, with succeeding objects in the array prioritized in a similarly descending order. Thus, "C.objB[0].y>3" is assigned the fourth priority, though both "C.objB[1].y>3" and "C.objB[0].y>3" come from the soft constraint SC2. The lowest-priority constraint is soft constraint SC1 from the definition of class A, so "C.x>2" is the fifth priority. In embodiments, other prioritization algorithms are used and in other embodiments the soft constraints are prioritized in a definitive way.

Figure 3:
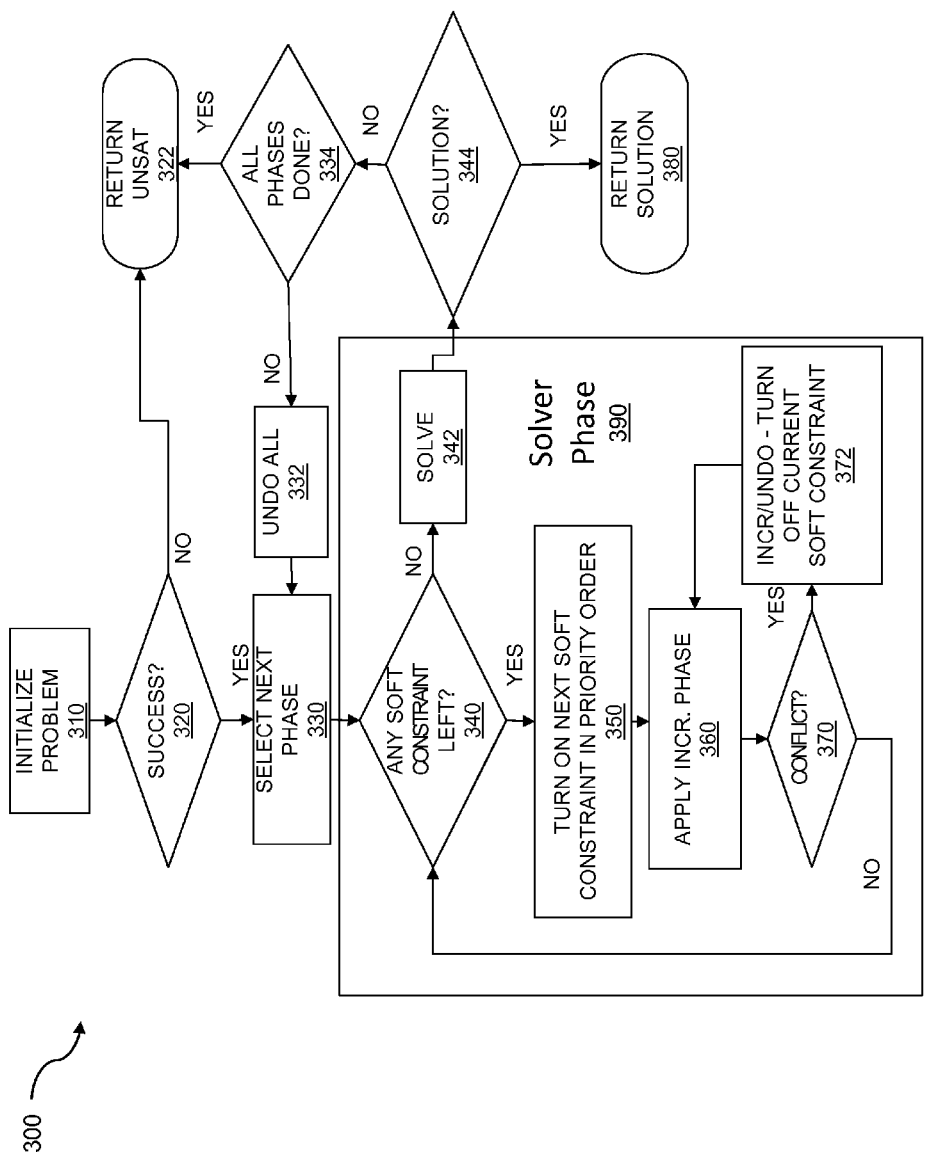
FIG. 3 is an example showing soft constraint solving.

FIG. 3 is an example showing soft-constraint solving. The flow 300 shows a meta-solver that utilizes a multi-phase solver 390. The flow 300 begins by initializing the design problem 310. In some embodiments, the initialization solves for hard constraints. In embodiments, the success of the initialization is checked 320 and if the initialization failed due to inconsistent hard constraints or another reason, the flow 300 returns a result of unsatisfied 322, signifying a failure. If the initialization is a success, the first stage of the solver is selected 330 and the first phase of the solver 390 attempts to solve the design problem.

In embodiments, the solver will have any number of stages. A solver phase is able to return a complete solution for at least some cases. A phase tests if a soft constraint can be honored in the presence of higher-priority soft constraints. A phase can be made incremental if it can generate inferences about the current problem that hold true for all the soft constraints previously honored, but is independent of soft constraints that are not honored yet. In some embodiments, every phase is engineered to be incremental so that the iterative cost in each step is minimized. The flow 300 uses solver phases in order of complexity to find a solution as early as possible at minimal cost. The solver has three phases in at least one embodiment.

In at least one embodiment, the first phase uses static implications. Static implications are identical across soft constraints, but as a new soft constraint is added, in embodiments, inferences will need to be made for earlier soft constraints based on the newly-added soft constraint. In embodiments, the first phase is made incremental by associating static implication information on an enabled soft constraint basis. This allows an incremental undo in the case of a conflicting constraint by reverting only the implied information. In some embodiments, the first phase implements a method that relies on incremental implications on the enables to weed out soft-constraints that cannot be satisfied. In embodiments, the incremental implications are stored in a data-structure, called the soft-implication stack, that associates implications with the soft constraint that caused them. This technique allows the reuse of standard optimized sub-routines from the constraint solver to add and remove incremental information as the list of soft constraints to be solved is traversed.

As the first solver phase 390 begins, a list of soft constraints is checked to see if all the soft constraints have been evaluated 340. Since this is the first time through the first phase of the solver, the first, or highest priority, soft constraint is turned on 350 and the first phase solver is called to apply an incremental phase solver 360 to the design problem while the first soft constraint is on. The results are checked to see if a conflict was detected 370. If a conflict was detected, the soft constraint being tested is turned off, and the other soft constraints revert back to their previous conditions 372 by running the incremental phase 360 again without the new soft constraint in order to remove any implications from the soft constraint being tested. If no conflict is detected, the system checks for additional soft constraints 340. If one or more soft constraints are found, the next soft constraint in priority order is added 350 and another incremental phase is run 360.

Because the first phase walks through the list of soft-constraints in priority order, turning on a soft constraint and performing incremental implications at each step, the computation cost of this phase approximately equals the cost of a single static implication with all the soft constraints turned on. If the existing set of implications implies that the current soft constraint is already off—e.g. through implications from higher priority soft enables—then the new constraint is marked as not honored. During the first phase, a lower-priority soft constraint could not be set to on through implication from either turning on or off a higher priority soft constraint. If an iterative static implication step succeeds, there is no guarantee that a solution is available. However, if the implications fail, then that constraint cannot be satisfied. At the end of this iterative loop, a superset of soft constraints that can be satisfied is enabled.

In embodiments, once all the soft constraints have been checked, a solver is used to attempt to find a solution to the design problem 342 using the set of soft constraints that were left on by the first phase of the solver. Multiple types of solvers can be utilized including branch and bound techniques, binary decision diagrams based solvers, and so on. The results of the solver are checked 344 and if no solution is found, a check is made to see if all phases of the solver have been tried 334. If there is no solution and all phases have been tried, the design problem is returned unsatisfied 322. If there are still phases of the solver left to try, the work of the previous phase is undone 332 and the next phase of the solver is selected 330. In at least some embodiments, the second phase of the solver uses a static learning approach.

The static learning phase has the same properties as static implications, except that the inferences are considerably stronger than those of static implications. In embodiments, the implications which were discovered in the first phase are augmented with an incremental static learning step for each soft-enable state. The method is nearly identical to the first phase, except that the incremental stack also holds the incremental learned information, as well as the incremental implications. Each successful learning step first sets the value of the current soft constraint to On, and then performs static learning in the cone of the enabled soft constraint. The incremental learning performs case-based learning for candidate nodes. This case-based learning can find inconsistencies that static implications miss. In embodiments, the stack in second phase tracks the stack in first phase by producing an equivalent entry for each successful implication step. Backtracking is augmented to remove the incremental learned information for a failed soft-enable state. This rolls the circuit back to a consistent state. This rolling back is accomplished by first undoing the learned information and then undoing the implications for an inconsistent soft-enable assignment.

If the call to the branch and bound solver is not able to solve the design problem after the second phase, the results of the second phase are undone 332 and the third phase of the solver selected 330. In embodiments, the third phase of the solver is an incremental branch and bound solver which is able to find a solution if one exists, but in some embodiments, requires time that is exponential with problem size in the worst case. If any phase of the solver is found to be successful in finding a solution to the design problem 344, the solution is returned 380. In this manner, embodiments of the flow 300 include solving the design problem.

Figure 4:
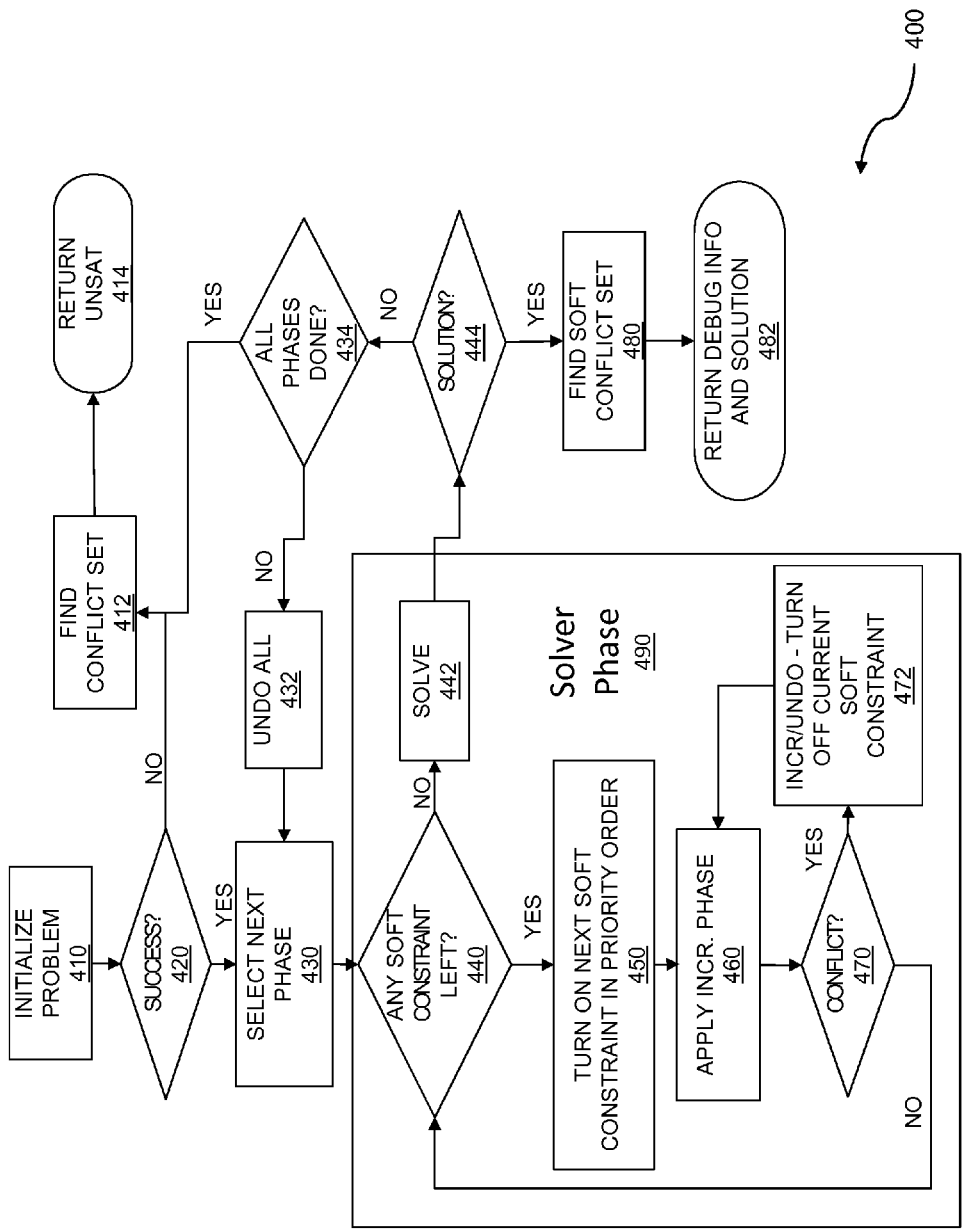
FIG. 4 is an example showing soft constraint debug.

FIG. 4 is an example showing soft-constraint debug. The flow 400 is similar to the flow 300 of FIG. 3 and shows a meta-solver that utilizes a multi-phase solver 490. The flow 400 begins by initializing the design problem 410. In some embodiments, the initialization solves for hard constraints. In embodiments, the success of the initialization is checked 420 and if the initialization failed due to inconsistent hard constraints, the flow 400 finds a conflicting set of hard constraints 412 that, in embodiments, will not be satisfied. In some embodiments, the conflicting set contains a list of hard constraints that cannot be satisfied by the static implication in the initialization 410. In some embodiments, the flow 400 will then return a result of unsatisfied 414. If the initialization is a success, the first stage of the solver is selected 430 and the next phase of solver 490 attempts to solve the design problem.

In embodiments, the solver will have any number of stages, but the last phase, in some embodiments, will be a branch-and-bound solver. In embodiments, each phase will successively check for the next soft constraint 440, turn it on 450, and apply an incremental stage 460 of that phase of the solver. In embodiments, a check for a conflict is made 470, and if a conflict is found, the constraint is turned off and the results related to that soft constraint undone 472 by reapplying the incremental phase 460 with that soft constraint off. In embodiments, if no conflict is found, a check for the next soft constraint is made 440 and the loop repeated until no soft constraints remain for this phase of the solver. Once the constraints have been checked and a subset of soft constraints enabled, in embodiments the branch-and-bound solver is called on to solve the design problem 442.

The results of the solver are checked 444 and if no solution was found a check is made to see if all phases of the solver have been tried 434. In some embodiments, if there is no solution and all phases have been tried, the conflicting set—in this case all are hard constraints—will be found 412 and the design problem may be returned unsatisfied 414. If there are still phases of the solver left to try, the work of the previous phase is undone 432 and the next phase of the solver is selected 430.

If a solution was found 444, a set of soft constraints that were not honored is found 480. In some embodiments, a root cause of the soft constraints that were not honored is also identified. In some embodiments, a root cause will include another constraint from the set of constraints. In other embodiments, the constraints in the root cause will be hard constraints and/or soft constraints with a higher priority than the soft constraint that was not honored. Once the unsatisfied soft constraints and, in some embodiments, the root causes, are determined, they are in some embodiments returned as debug information along with the solution 482. In embodiments, a designer will be able to use the debug information to decide whether the solution is acceptable and/or to modify the constraints of the design problem to attempt an improved solution.

Figure 5:
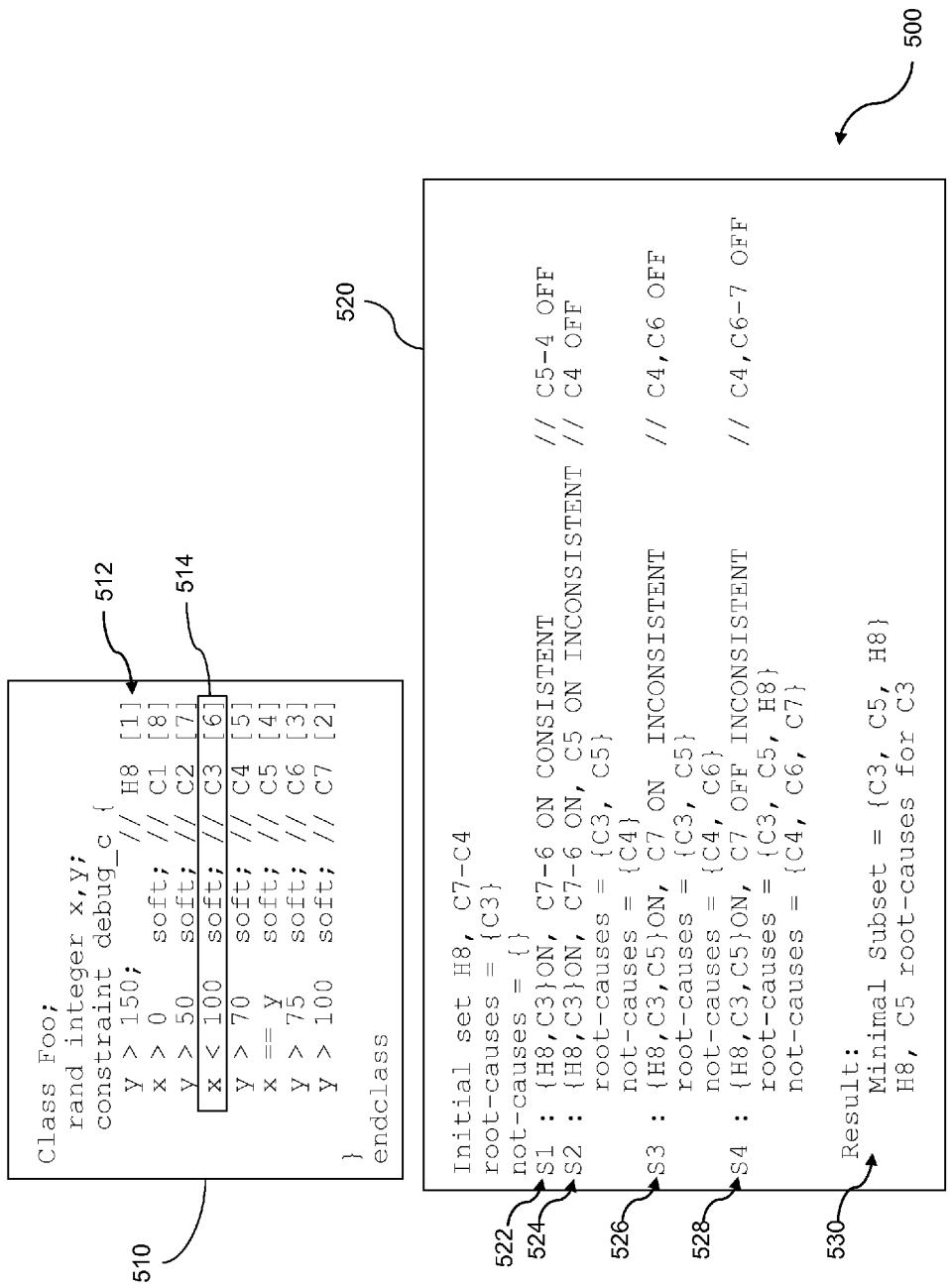
FIG. 5 shows an example soft constraint root-cause analysis.

FIG. 5 shows an example 500 soft constraint root-cause analysis. The example 500 includes a set of constraints 510, which, in some embodiments, includes hard constraints, and include one or more soft constraints. In embodiments, the hard constraints 512 will be assigned highest priority, although some embodiments will solve for the hard constraints separately, rendering solving for the hard constraints a requirement without a priority per se. In some embodiments, the other constraints 510 will be soft constraints, which, in embodiments, will be given a priority based on their order of declaration. In this way, the first soft constraint defined, "x>0," is assigned the lowest priority and the last soft constraint defined, "y>100," is given highest priority, other than the hard constraints. One constraint, C3 514, is not consistent with the one or more of the constraints that are higher priority.

The analysis 520 shows a process which, in embodiments, is used to determine a root-cause. Thus, in some embodiments, the soft-constraint root-cause analysis 512 includes identifying a base problem for not honoring the at least one soft constraint. The initial set of soft constraints that have already been shown to be consistent contains the hard constraint, H8, and the four highest priority soft constraints, C7, C6, C5, and C4. In some embodiments, it has been predetermined that the soft constraint C3 is inconsistent with the higher-priority constraints, so the soft constraint C3 is included in the "root-causes" set of constraints and the set of "not-causes" is initialized to a null set. At S1 522, a call is made to the solver with the hard constraint H8 and the soft constraint being evaluated for root cause, C3, turned on. The higher-priority soft constraints, C7-C4 are divided into two groups with the group that includes C7 and C6 turned on and included in the solving. In this case, the group that includes C5 and C4 is turned off and is not included in the solving. In the embodiment shown, the solver determines that constraints H8, C3, C7, and C6 are consistent with each other, so for the next call to the solver at S2 524, the second group is divided—C5 is turned on and C4 is left off. In this case, the solver finds the set of soft constraints to be inconsistent with each other, showing that C5 is a root cause and C4 is not a root cause.

At S3 526, the solver is called with H8, C3, and C5 turned on and the first group of soft constraints divided so that C7 is set to on and C6 is turned off. In embodiments, the solver will then find that the set comprising constraints H8, C3, C5 and C7 is inconsistent, allowing C6 to be added to the "not-causes" set. At S4 528, if constraint C7 is turned off and the solver finds that the set comprising constraints H8, C3, and C5 is inconsistent, in embodiments, C7 will be added to the "not-causes" set, leaving a minimal subset of root-cause problems for C3 as C5 and H8. In some embodiments, the result 530 will then be reported to the user.

Figure 6:
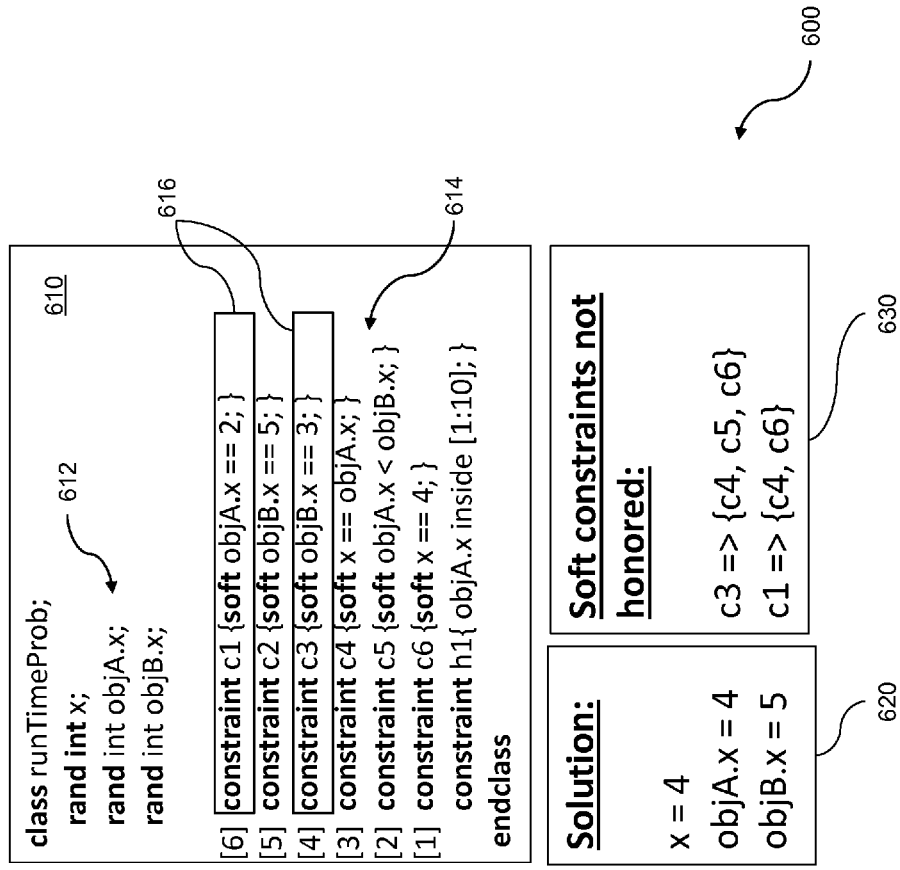
FIG. 6 is an example rendering for soft constraint debug.

FIG. 6 is an example rendering 600 for soft-constraint debug. In embodiments, the rendering 600 includes different elements than in other embodiments but the rendering 600 includes a first window 610 showing at least a portion of the design problem, a second window 620 showing a solution to the design problem, and a third window 630 showing debug information. In embodiments, the first window 610 shows various aspects of the design problem. In the example shown, the declarations for variables 612 and the constraints 614 of the design problem are shown. In embodiments, soft constraints that are not honored 616 are highlighted, thus reporting the at least one soft constraint which is not honored by the solving. Alternate embodiments show more or less of the design problem.

The second window 610 shows a solution to the design problem. Three random variables, along with at least one random solution, that were declared in the design problem shown in the first window 610 and are consistent with the hard constraints of the design problem and as many soft constraints of the design problem as possible, are shown. Some embodiments will show more than one solution to the design problem in the second window 620, if more than one solution is possible.

In embodiments, the third window 630 will show debug information, such as a listing of soft constraints that are not honored by the solution and/or a root-cause analysis of why those soft constraints were not honored. Soft constraint C3 is identified as not being met with a root cause of the set of soft constraints {C4, C5, C6}, so, in embodiments, the root cause will include another constraint from the set of constraints. In some embodiments, the root cause of a constraint that is not honored shall include one or more hard constraints and/or one or more soft constraints having a higher priority than the constraint that is not honored. Thus, in some embodiments, the identifying the root cause will be based on an order of priority for the plurality of soft constraints. A second soft constraint, C1, is also not honored and it is shown with its set of root cause constraints {C4, C6}, thus, embodiments include identifying a root cause for not honoring the one or more soft constraints which were not met, and reporting the root cause. In some embodiments, such information is useful for debugging the design problem.

Figure 7:
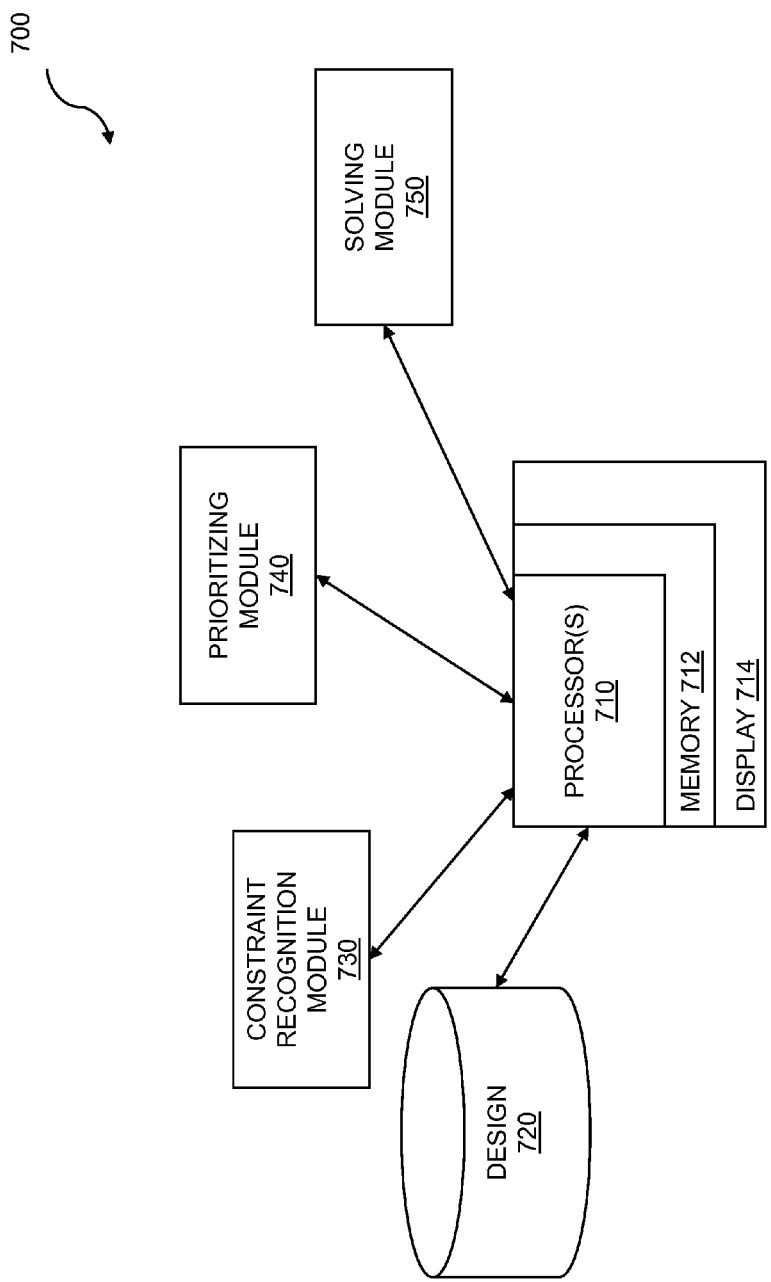
FIG. 7 is a system diagram for prioritized soft constraint solving.

FIG. 7 is a system diagram for prioritized soft-constraint solving. In embodiments, the system diagram 700 is used for a computer-implemented method for semiconductor design implementation. The system 700 includes one or more processors 710 coupled to a memory 712, which, in embodiments, is used to store computer code, instructions, and/or data. In some embodiments, a display 714 will be included. In embodiments, the display 714 will be any electronic display, including but not limited to, a computer display, a laptop screen, a net-book screen, a tablet screen, a cell phone display, a mobile device display, a remote with a display, a television, a projector, or the like. In embodiments, a design problem 720 is stored on a computer disk or another computer storage medium. In some embodiments, the design problem includes a set of constraints. In embodiments, the design problem is obtained by accessing the design problem 720 over a computer communication interface or by using any other method. A constraint recognition module 730 includes computer code to allow the one or more processors 714 to recognize a plurality of soft constraints within the set of constraints in the design problem. A prioritizing module 740 includes computer code to prioritize one of more of the plurality of constraints in the design problem 720. A solving module 750 includes computer code to allow the one or more processors 714 to solve the design problem 720 and to determine at least one constraint which is not honored by the solving. Thus, embodiments of the system 700 include a combination of hardware and software for obtaining a set of constraints that define a semiconductor design problem wherein solving the design problem provides a specific chip operation, recognizing a plurality of soft constraints within the set of constraints wherein the soft constraints provide preferred but not absolute needs for a semiconductor chip, prioritizing one or more of the plurality of soft constraints, solving the design problem, determining a soft constraint which is not honored by the solving, and debugging the soft constraint which is not honored.

Embodiments of the system 700 include a computer program product embodied in a non-transitory computer readable medium for design implementation. In some embodiments, the computer program product embodied in a non-transitory computer readable medium for design implementation will include code for obtaining a set of constraints for a design problem 720, code for recognizing a plurality of soft constraints 730 within the set of constraints, code for prioritizing one or more of the plurality of soft constraints, code for solving the design problem, and code for determining at least one soft constraint which is not honored by the solving.

Each of the above methods may be executed on one or more processors on one or more computer systems. Embodiments may include various forms of distributed computing, client/server computing, and cloud based computing. Further, it will be understood that the depicted steps or boxes contained in this disclosure's flow charts are solely illustrative and explanatory. The steps may be modified, omitted, repeated, or re-ordered without departing from the scope of this disclosure. Further, each step may contain one or more sub-steps. While the foregoing drawings and description set forth functional aspects of the disclosed systems, no particular implementation or arrangement of software and/or hardware should be inferred from these descriptions unless explicitly stated or otherwise clear from the context. All such arrangements of software and/or hardware are intended to fall within the scope of this disclosure.

The block diagrams and flowchart illustrations depict methods, apparatus, systems, and computer program products. The elements and combinations of elements in the block diagrams and flow diagrams, show functions, steps, or groups of steps of the methods, apparatus, systems, computer program products and/or computer-implemented methods. Any and all such functions—generally referred to herein as a "circuit," "module," or "system"—may be implemented by computer program instructions, by special-purpose hardware-based computer systems, by combinations of special purpose hardware and computer instructions, by combinations of general purpose hardware and computer instructions, and so on.

A programmable apparatus which executes any of the above mentioned computer program products or computer-implemented methods may include one or more microprocessors, microcontrollers, embedded microcontrollers, programmable digital signal processors, programmable devices, programmable gate arrays, programmable array logic, memory devices, application specific integrated circuits, or the like. Each may be suitably employed or configured to process computer program instructions, execute computer logic, store computer data, and so on.

It will be understood that a computer may include a computer program product from a computer-readable storage medium and that this medium may be internal or external, removable and replaceable, or fixed. In addition, a computer may include a Basic Input/Output System (BIOS), firmware, an operating system, a database, or the like that may include, interface with, or support the software and hardware described herein.

Embodiments of the present invention are neither limited to conventional computer applications nor the programmable apparatus that run them. To illustrate: the embodiments of the presently claimed invention could include an optical computer, quantum computer, analog computer, or the like. A computer program may be loaded onto a computer to produce a particular machine that may perform any and all of the depicted functions. This particular machine provides a means for carrying out any and all of the depicted functions.

Any combination of one or more computer readable media may be utilized including but not limited to: a non-transitory computer readable medium for storage; an electronic, magnetic, optical, electromagnetic, infrared, or semiconductor computer readable storage medium or any suitable combination of the foregoing; a portable computer diskette; a hard disk; a random access memory (RAM); a read-only memory (ROM), an erasable programmable read-only memory (EPROM, Flash, MRAM, FeRAM, or phase change memory); an optical fiber; a portable compact disc; an optical storage device; a magnetic storage device; or any suitable combination of the foregoing. In the context of this document, a computer readable storage medium may be any tangible medium that can contain or store a program for use by or in connection with an instruction execution system, apparatus, or device.

It will be appreciated that computer program instructions may include computer executable code. A variety of languages for expressing computer program instructions may include without limitation C, C++, Java, JavaScript™, ActionScript™, assembly language, Lisp, Perl, Tcl, Python, Ruby, hardware description languages, database programming languages, functional programming languages, imperative programming languages, and so on. In embodiments, computer program instructions may be stored, compiled, or interpreted to run on a computer, a programmable data processing apparatus, a heterogeneous combination of processors or processor architectures, and so on. Without limitation, embodiments of the present invention may take the form of web-based computer software, which includes client/server software, software-as-a-service, peer-to-peer software, or the like.

In embodiments, a computer may enable execution of computer program instructions including multiple programs or threads. The multiple programs or threads may be processed approximately simultaneously to enhance utilization of the processor and to facilitate substantially simultaneous functions. By way of implementation, any and all methods, program codes, program instructions, and the like described herein may be implemented in one or more threads which may in turn spawn other threads, which may themselves have priorities associated with them. In some embodiments, a computer may process these threads based on priority or other order.

Unless explicitly stated or otherwise clear from the context, the verbs "execute" and "process" may be used interchangeably to indicate execute, process, interpret, compile, assemble, link, load, or a combination of the foregoing. Therefore, embodiments that execute or process computer program instructions, computer-executable code, or the like may act upon the instructions or code in any and all of the ways described. Further, the method steps shown are intended to include any suitable method of causing one or more parties or entities to perform the steps. The parties performing a step, or portion of a step, need not be located within a particular geographic location or country boundary. For instance, if an entity located within the United States causes a method step, or portion thereof, to be performed outside of the United States then the method is considered to be performed in the United States by virtue of the causal entity.

While the invention has been disclosed in connection with preferred embodiments shown and described in detail, various modifications and improvements thereon will become apparent to those skilled in the art. Accordingly, the forgoing examples should not limit the spirit and scope of the present invention; rather it should be understood in the broadest sense allowable by law.

What is claimed is:

1. A computer program product embodied in a non-transitory computer readable medium for causing a computer to perform a design implementation, the computer program product comprising code for:
   recognizing a plurality of soft constraints within a set of constraints for a design problem;
   prioritizing one or more of the plurality of soft constraints;
   solving the design problem; and
   determining at least one soft constraint which is not honored by the solving.

2. The computer program product of claim 1 further comprising code for identifying one or more of the plurality of soft constraints which are honored by the solving.

3. The computer program product of claim 1 further comprising code for identifying a root cause for not honoring the at least one soft constraint which is not honored by the solving.

4. The computer program product of claim 1 further comprising code for performing a resource allocation so that the design problem is solved within global resource limits identified by the resource allocation.

5. A computer-implemented method for semiconductor design implementation comprising:
   recognizing a plurality of soft constraints within a set of constraints, that define a semiconductor design problem wherein solving the semiconductor design problem provides a specific chip operation, wherein the plurality of soft constraints provide preferred but not absolute needs for a semiconductor chip;
   prioritizing one or more of the plurality of soft constraints;
   solving the semiconductor design problem;
   determining a soft constraint which is not honored by the solving; and
   debugging the soft constraint which is not honored.

6. The computer-implemented method of claim 5 wherein the design problem is for a semiconductor chip.

7. The computer-implemented method of claim 6 wherein the design problem includes one or more of verification, timing, power, or area.

8. The computer-implemented method of claim 7 wherein information on timing includes one or more of setup time, hold time, access time, or cycle time.

9. The computer-implemented method of claim 8 wherein the design problem includes an analysis of arrival time or slack time.

10. The computer-implemented method of claim 7 wherein information on power includes one or more of standby power, leakage power, dynamic power, power-down power, or static power.

11. The computer-implemented method of claim 7 wherein information on area includes one or more of metallization area, diffusion area, or polysilicon area.

12. The computer-implemented method of claim 5 further comprising caching a solution for the design problem, based on the solving, into a problem storage.

13. The computer-implemented method of claim 12 wherein the caching is based on prioritized constraints wherein the prioritized constraints are soft constraints that are part of an object graph and wherein priorities are assigned using an ordered walk on the object graph.

14. The computer-implemented method product of claim 5 wherein the solving of the design problem is based on the prioritizing of the one or more of the plurality of soft constraints.

15. The computer-implemented method of claim 14 wherein the prioritizing selects higher priority soft constraints for solving before lower priority soft constraints.

16. The computer-implemented method of claim 14 wherein the prioritizing performs weighted allocations of resources for the solving of the plurality of soft constraints.

17. The computer-implemented method of claim 5 further comprising reporting the at least one soft constraint which is not honored by the solving.

18. The computer-implemented method of claim 17 further comprising identifying a root cause for not honoring the at least one soft constraint which was not met, and reporting the root cause.

19. The computer-implemented method of claim 5 further comprising identifying one or more of the plurality of soft constraints which are honored by the solving.

20. The computer-implemented method of claim 5 further comprising identifying a root cause for not honoring the at least one soft constraint which is not honored by the solving.

21. The computer-implemented method of claim 20 wherein the root cause includes another constraint from the set of constraints.

22. The computer-implemented method of claim 21 wherein the root cause includes a hard constraint.

23. The computer-implemented method of claim 21 wherein the root cause includes a soft constraint with a higher priority than the at least one soft constraint which is not honored.

24. The computer-implemented method of claim 21 wherein the identifying the root cause is based on an order of priority for the plurality of soft constraints.

25. The computer-implemented method of claim 5 further comprising performing a resource allocation so that the design problem is solved within global resource limits identified by the resource allocation.

26. A computer system for design implementation comprising:
   a memory which stores instructions;
   one or more processors coupled to the memory wherein the one or more processors are configured to perform the following actions:
   identifying a plurality of soft constraints within a set of constraints for a design problem;
   prioritizing one or more of the plurality of soft constraints;
   solving the design problem; and
   identifying at least one soft constraint which is not honored by the solving.

27. The computer system of claim 26 wherein the one or more processors are further configured to identify one or more of the plurality of soft constraints which are honored by the solving.

28. The computer system of claim 26 wherein the one or more processors are further configured to identify a root cause for not honoring the at least one soft constraint which is not honored by the solving.

29. The computer system of claim 26 wherein the one or more processors are further configured to perform a resource allocation so that the design problem is solved within global resource limits identified by the resource allocation.

* * * * *